US009859354B2

(12) United States Patent
Kang et al.

(10) Patent No.: US 9,859,354 B2
(45) Date of Patent: Jan. 2, 2018

(54) ORGANIC LIGHT EMITTING DIODE DISPLAY

(71) Applicant: SAMSUNG DISPLAY CO., LTD., Yongin-si, Gyeonggi-do (KR)

(72) Inventors: Seock Hwan Kang, Seoul (KR); Won Sang Park, Yongin-si (KR); Jae Ik Lim, Hwaseong-si (KR); Jin-Woo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/096,001

(22) Filed: Apr. 11, 2016

(65) Prior Publication Data

US 2016/0322444 A1     Nov. 3, 2016

(30) Foreign Application Priority Data

Apr. 30, 2015   (KR) .......................... 10-2015-0062084

(51) Int. Cl.
*H01L 27/32*     (2006.01)
*H01L 51/52*     (2006.01)

(52) U.S. Cl.
CPC ........ *H01L 27/3272* (2013.01); *H01L 27/322* (2013.01); *H01L 27/3246* (2013.01);
(Continued)

(58) Field of Classification Search
CPC ............... H01L 27/3272; H01L 27/322; H01L 27/3246; H01L 27/323; H01L 51/5281; H01L 51/5284; H01L 51/5253
See application file for complete search history.

(56) References Cited

U.S. PATENT DOCUMENTS 8,816,358 B1\* 8/2014 Tsai ...................... H01L 27/307
257/79
2008/0150421 A1\* 6/2008 Takata ................ H01L 27/3244
313/504

(Continued)

FOREIGN PATENT DOCUMENTS

JP    2008-176291 A    7/2008
KR    10-0551027 B1    2/2006

(Continued)

*Primary Examiner* — Christine Enad
(74) *Attorney, Agent, or Firm* — Lewis Roca Rothgerber Christie LLP

(57) ABSTRACT

An organic light emitting diode display includes a substrate, a thin film transistor on the substrate, a first electrode on and connected to the thin film transistor, a pixel defining layer on the first electrode and defining a pixel area, an organic light emitting layer on the first electrode and contacting the first electrode exposed in the pixel area, a second electrode on the organic light emitting layer, and a light blocking layer on the second electrode and exposing the second electrode at a position corresponding to the pixel area. The light blocking layer may include a first metal layer on the second electrode and exposing the second electrode at a position corresponding to the pixel area, a first intermediate layer covering the first metal layer, a second metal layer covering the first intermediate layer, and a second intermediate layer covering the second metal layer.

5 Claims, 8 Drawing Sheets

(52) U.S. Cl.
CPC ...... *H01L 51/5281* (2013.01); *H01L 51/5284* (2013.01); *H01L 27/323* (2013.01); *H01L 51/5253* (2013.01)

(56) References Cited

U.S. PATENT DOCUMENTS

| | | | |
|---|---|---|---|
| 2008/0151133 A1* | 6/2008 | Kim | G02F 1/13338 349/12 |
| 2010/0248433 A1* | 9/2010 | Miyairi | H01L 29/66765 438/158 |
| 2012/0099048 A1* | 4/2012 | Yamazaki | G02F 1/133514 349/62 |
| 2014/0028181 A1* | 1/2014 | Lee | H05B 33/14 313/504 |
| 2015/0340575 A1* | 11/2015 | Nakabayashi | H01L 33/486 257/91 |

FOREIGN PATENT DOCUMENTS

| | | |
|---|---|---|
| KR | 10-2007-0115751 A | 12/2007 |
| KR | 10-2008-0041954 A | 5/2008 |
| KR | 10-2009-0046100 A | 5/2009 |
| KR | 10-2012-0122534 A | 11/2012 |
| KR | 10-2013-0046913 A | 5/2013 |

* cited by examiner

ORGANIC LIGHT EMITTING DIODE DISPLAY

CROSS-REFERENCE TO RELATED APPLICATION

This application claims priority to and the benefit of Korean Patent Application No. 10-2015-0062084, filed in the Korean Intellectual Property Office on Apr. 30, 2015, the entire content of which is incorporated herein by reference.

BACKGROUND

1. Field

Aspects of embodiments of the present invention relate to an organic light emitting diode display.

2. Description of the Related Art

An organic light emitting element of an organic light emitting diode display includes two electrodes and an organic light emitting layer positioned therebetween. Electrons injected from a cathode, which is one of the electrodes, and holes injected from an anode, which is another one of the electrodes, are combined with each other in the organic light emitting layer to form excitons. The formed excitons emit energy, such that the organic light emitting element emits light.

The organic light emitting diode display includes a plurality of pixels each including an organic light emitting element composed of a cathode, an anode, and an organic light emitting layer. Each of the pixels is provided with a plurality of transistors and a storage capacitor to drive the organic light emitting element. The transistors include a switching transistor and a driving transistor.

Each of the pixels may be partitioned by a pixel defining layer for which a light emitting region is opened. Organic light emitting elements including light emitting layers emitting red, green, and blue light may be formed in the opened light emitting regions of the pixel defining layer. In addition, further elements such as a polarization film and a phase difference film, a black thin film, or a color filter are formed thereon, thereby constituting a display panel.

Display panels constituted as described above may become thick due to the combined thickness of the pixel defining layer, the polarization film, the phase difference film, and the color filter, together a number of different other elements present in addition to the organic light emitting elements, such that light emitting efficiency may be decreased.

The above information disclosed in this Background section is only for enhancement of understanding of the background of the present invention and therefore it may contain information that does not form the prior art that is already known in this country to a person of ordinary skill in the art.

SUMMARY

Embodiments of the present invention provide for an organic light emitting diode display. Further embodiments provide for an organic light emitting diode display capable of preventing contrast and visibility from being deteriorated by reflection of external light.

In an embodiment of the present invention, an organic light emitting diode display is provided. The organic light emitting diode display includes a substrate, a thin film transistor on the substrate, a first electrode on and connected to the thin film transistor, a pixel defining layer on the first electrode and defining a pixel area, an organic light emitting layer on the first electrode and contacting the first electrode exposed in the pixel area, a second electrode on the organic light emitting layer, and a light blocking layer on the second electrode and exposing the second electrode at a position corresponding to the pixel area.

The light blocking layer may include a light blocking material.

The light blocking material may include at least one of carbon black, carbon nanotube (CNT), and black dye.

The light blocking layer may further include a conductive metal, a conductive metal oxide, or a conductive metal nitride.

The conductive metal may be selected from the group consisting of Al, Ag, Mg, Cr, Ti, Ni, Au, Ta, Cu, Ca, Co, Fe, Mo, W, Pt, Yb, and NiS, or an alloy thereof.

The conductive metal oxide may be selected from the group consisting of $CrO_x$ ($x \geq 1$), $CuO_x$ ($x \geq 1$), and $MoO_x$ ($x \geq 1$), or a combination thereof.

The conductive metal nitride may be selected from the group consisting of $TiN_x$ ($x \geq 1$), $TiN_xAl$ ($x \geq 1$), and $CrN_x$ ($x \geq 1$), or a combination thereof.

The organic light emitting diode display may further include a color filter layer at a position corresponding to the pixel area and contacting the second electrode.

The organic light emitting diode display may further include an encapsulation layer on the light blocking layer to cover the light blocking layer and the second electrode, and a color filter layer on the encapsulation layer.

The organic light emitting diode display may further include a polarizing plate on the light blocking layer.

The organic light emitting diode display may further include an encapsulation layer between the light blocking layer and the polarizing plate.

In another embodiment of the present invention, an organic light emitting diode display is provided. The organic light emitting diode display includes a substrate, a thin film transistor on the substrate, a first electrode on and connected to the thin film transistor, a pixel defining layer on the first electrode and defining a pixel area, an organic light emitting layer on the first electrode and contacting the first electrode exposed in the pixel area, a second electrode on the organic light emitting layer, a first metal layer on the second electrode and exposing the second electrode at a position corresponding to the pixel area, a first intermediate layer covering the first metal layer, a second metal layer covering the first intermediate layer, and a second intermediate layer covering the second metal layer.

The first and second metal layers may be configured so that external light reflected by the first metal layer and external light reflected by the second metal layer destructively interfere with each other.

The first metal layer may be selected from the group consisting of Ag, Al, Mg, Cr, Ti, Ni, W, Au, Ta, Cu, Co, Fe, Mo, and Pt, or an alloy thereof.

The second metal layer may be selected from the group consisting of Cr, Ti, Mo, Co, Ni, W, Al, Ag, Au, Cu, Fe, Mg, and Pt, or an alloy thereof.

The first and second intermediate layers may be selected from the group consisting of $SiO_x$ ($x \geq 1$), $SiN_x$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$, and $In_2O_3$, or a combination thereof.

Embodiments of the present invention provide for an organic light emitting diode display where, when a user uses the display outdoors, a vivid image is displayed and contrast and visibility are not deteriorated. Further embodiments provide for an organic light emitting diode display where a light blocking layer is used instead of a polarizing plate, such that light emitted from the organic light emitting layer may be appropriately transferred to the outside, thereby making it possible to increase light efficiency. In addition, by removing the polarizing plate, the entire thickness of the display may be decreased.

Still further embodiments provide for an organic light emitting diode display where the light blocking layer has conductivity and contacts a pixel electrode, such that resistance of the pixel electrode may be decreased. This may make it possible to prevent luminance from being non-uniform due to a voltage drop (IR-drop) generated in the organic light emitting diode display.

DETAILED DESCRIPTION

Figure 1:
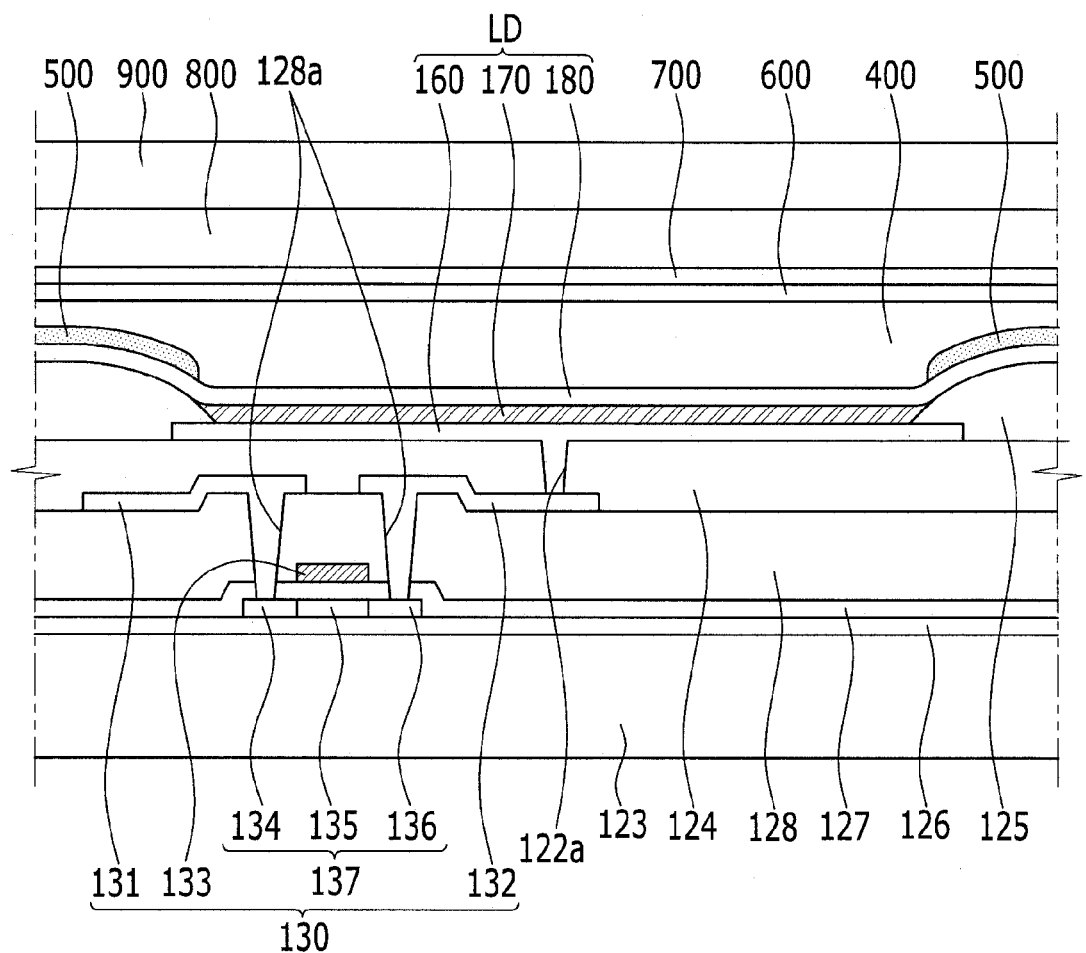
FIG. 1 is a schematic cross-sectional view of an organic light emitting diode display according to a first embodiment of the present invention.

Hereinafter, example embodiments of the present invention will be described in detail with reference to the accompanying drawings so that those skilled in the art to which the present invention pertains may easily practice the present invention. As those skilled in the art would realize, the described embodiments may be modified in various different ways, all without departing from the spirit or scope of the present invention. The drawings and description are to be regarded as illustrative in nature and not restrictive. Like reference numerals designate like elements throughout the specification and drawings.

In addition, since sizes, shapes, and thicknesses of the respective components shown in the accompanying drawings may be arbitrarily shown for convenience of explanation, the present invention is not necessarily limited to contents shown (e.g., sizes, shapes, and thicknesses) in the accompanying drawings. For example, in the drawings, the thickness of layers, films, panels, regions, etc., may be exaggerated for clarity. In addition, in the accompanying drawings, thicknesses of some of layers and regions may have been exaggerated for convenience of explanation. It will be understood that when an element such as a layer, film, region, or substrate is referred to as being "on" another element, it can be directly on the other element or intervening elements may also be present.

In addition, throughout the present specification, unless explicitly described to the contrary, the word "comprise" and variations such as "comprises" or "comprising" will be understood to imply the inclusion of stated elements but not the exclusion of any other elements. In addition, throughout the specification, the word "on" does not necessarily mean that an element is positioned at an upper side based on a gravity direction, but means that the element may be positioned above or below a target portion.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

Hereinafter, an organic light emitting diode display according to a first embodiment will be described with reference to FIGS. 1 and 2.

FIG. 1 is a schematic cross-sectional view of the organic light emitting diode display. FIG. 2 is a plan view of the organic light emitting diode display in which a light blocking layer is disposed.

Referring to FIG. 1, the organic light emitting diode display includes a substrate 123, a thin film transistor 130, a pixel defining layer 125, a first electrode 160, an organic light emitting layer 170, a second electrode 180, and a light blocking layer 500.

The substrate 123 may be formed as an insulating substrate made of glass, quartz, ceramic, plastic, or the like. However, the present invention is not limited thereto, and in other embodiments, the substrate 123 may be made of an insulating material having flexibility such as one or more of polyimide (PI), polyetherimide (PEI), polyethylene terephthalate (PET), polycarbonate (PC), polymethylmethacrylate (PMMA), polystyrene (PS), a styreneacrylonitrile (SAN) copolymer, and a silicon-acrylic resin.

A substrate buffer layer 126 is formed on the substrate 123. The substrate buffer layer 126 may serve, for example, to prevent permeation of impure elements and to planarize a surface. Here, the substrate buffer layer 126 may be made of various materials capable of performing one or more of the above-mentioned functions. For example, the substrate buffer layer 126 may be any one or more of a silicon nitride (SiNx) layer, a silicon oxide (SiOx) layer, and a silicon oxynitride (SiOxNy) layer. However, the substrate buffer layer 126 is not a necessary element and, in some embodiments, may be omitted depending on the kind of substrate 123 and process conditions.

A driving semiconductor layer 137 may be formed on the substrate buffer layer 126. The driving semiconductor layer 137 may be formed of a polycrystalline silicon layer. In addition, the driving semiconductor layer 137 includes a channel region 135 on which impurities are not doped, and a source region 134 and a drain region 136 that are formed at both sides of the channel region 135 by doping. Here, a doped ionic material may be a p type impurity such as boron (B); for example, $B_2H_6$ may be mainly used. However, the impurity may vary depending on the kind of thin film transistor.

A gate insulating layer 127 made of silicon nitride (SiNx), a silicon oxide ($SiO_2$), or the like, is formed on the driving semiconductor layer 137. A gate wire including a driving gate electrode 133 is formed on the gate insulating layer 127. In addition, the driving gate electrode 133 is formed to overlap with at least a portion of the driving semiconductor layer 137, particularly the channel region 135.

An interlayer insulating layer 128 covering the driving gate electrode 133 is formed on the gate insulating layer 127. Contact holes 128a exposing the source region 134 and the drain region 136 of the driving semiconductor layer 137 are formed in the gate insulating layer 127 and the interlayer insulating layer 128. The interlayer insulating layer 128 may be made of a ceramic-based material such as silicon nitride (SiN$_x$), a silicon oxide (SiO$_2$), or the like, similarly to the gate insulating layer 127.

In addition, a data wire including a driving source electrode 131 and a driving drain electrode 132 is formed on the interlayer insulating layer 128. The driving source electrode 131 and the driving drain electrode 132 are connected to the source region 134 and the drain region 136 of the driving semiconductor layer 137, respectively, through the contact holes 128a formed in the interlayer insulating layer 128 and the gate insulating layer 127.

As described above, the driving semiconductor layer 137, the driving gate electrode 133, the driving source electrode 131, and the driving drain electrode 132 form a driving thin film transistor 130. The configuration of the driving thin film transistor 130 is not limited thereto, and in other embodiments, may be variously changed into a configuration known in the art, which may be easily practiced by those skilled in the art.

A planarization layer 124 covering the data wire is formed on the interlayer insulating layer 128. The planarization layer 124 may serve, for example, to remove a step or other roughness or unevenness and to planarize a surface in order to increase light emitting efficiency of an organic light emitting element to be formed thereon. Further, the planarization layer 124 has an electrode via hole 122a exposing a portion of the drain electrode 132. The planarization layer 124 may be made of at least one material of polyacrylates resins, epoxy resins, phenolic resins, polyamides resins, polyimides resin, unsaturated polyesters resins, poly phenylenethers resins, poly phenylenesulfides resins, and benzocyclobutene (BCB).

The present invention is not limited to the above-mentioned structure, and in other embodiments, any one of the planarization layer 124 and the interlayer insulating layer 128 may be omitted.

Returning to FIG. 1, a first electrode 160 of the organic light emitting element is formed on the planarization layer 124. The first electrode is connected to the drain electrode 132 through the electrode via hole 122a of the planarization layer 124.

The pixel defining layer 125 covering an edge of the first electrode 160 is formed on the planarization layer 124. The pixel defining layer 125 may have an opening exposing a portion of the first electrode 160. An organic light emitting layer 170 to be described below is disposed on the exposed first electrode 160. Therefore, the pixel defining layer 125 may define a pixel area capable of emitting light. However, the pixel area defined by the pixel defining layer 125 may be thought of as only a virtual area since there are a number of further steps (such as those described below) that may be needed to make the pixel area actually capable of emitting light.

The organic light emitting layer 170 is formed on the first electrode 160, and the second electrode 180 is formed on the organic light emitting layer 170. Together, the first electrode 160, the organic light emitting layer 170, and the second electrode 180 form an organic light emitting element LD.

Here, the first electrode is an anode, which is a hole injection electrode, and the second electrode 180 is a cathode, which is an electron injection electrode. However, the present invention is not necessarily limited thereto, and in other embodiments, the first electrode 160 may become the cathode and the second electrode 180 may become the anode depending on factors such as a driving method of the organic light emitting diode display. When holes and electrons are injected into the organic light emitting layer 170 from the first electrode 160 and the second electrode 180, respectively, and combine to form excitons that fall from an excited state to a ground state, light is emitted.

In addition, the organic light emitting layer 170 is formed of a multilayer including a light emitting layer (EML) and at least one of a hole injection layer (HIL), a hole transporting layer (HTL), an electron transporting layer (ETL), and an electron injection layer (EIL). When the organic light emitting layer includes all of the hole injection layer, the hole transporting layer, the electron transporting layer, and the electron injection layer, the hole injection layer may be disposed on the first electrode 160, which is the anode, and the hole transporting layer, the light emitting layer, the electron transporting layer, and the electron injection layer may be sequentially stacked thereon.

Each of the first electrode 160 and the second electrode 180 may be formed of a transparent conductive material or a transflective or reflective conductive material. The organic light emitting diode display may be classified, for example, into a top-emission type, a bottom-emission type, or a two-sided emission type, depending on the kind of material (for example, its transparency) forming the first electrode 160 and the second electrode 180.

In the organic light emitting diode display of FIG. 1, the light blocking layer 500 is partially disposed on the second electrode 180, exposing the second electrode 180 at a position corresponding to the pixel area. For example, the light blocking layer 500 may coincide with the pixel defining layer 125.

Figure 2:
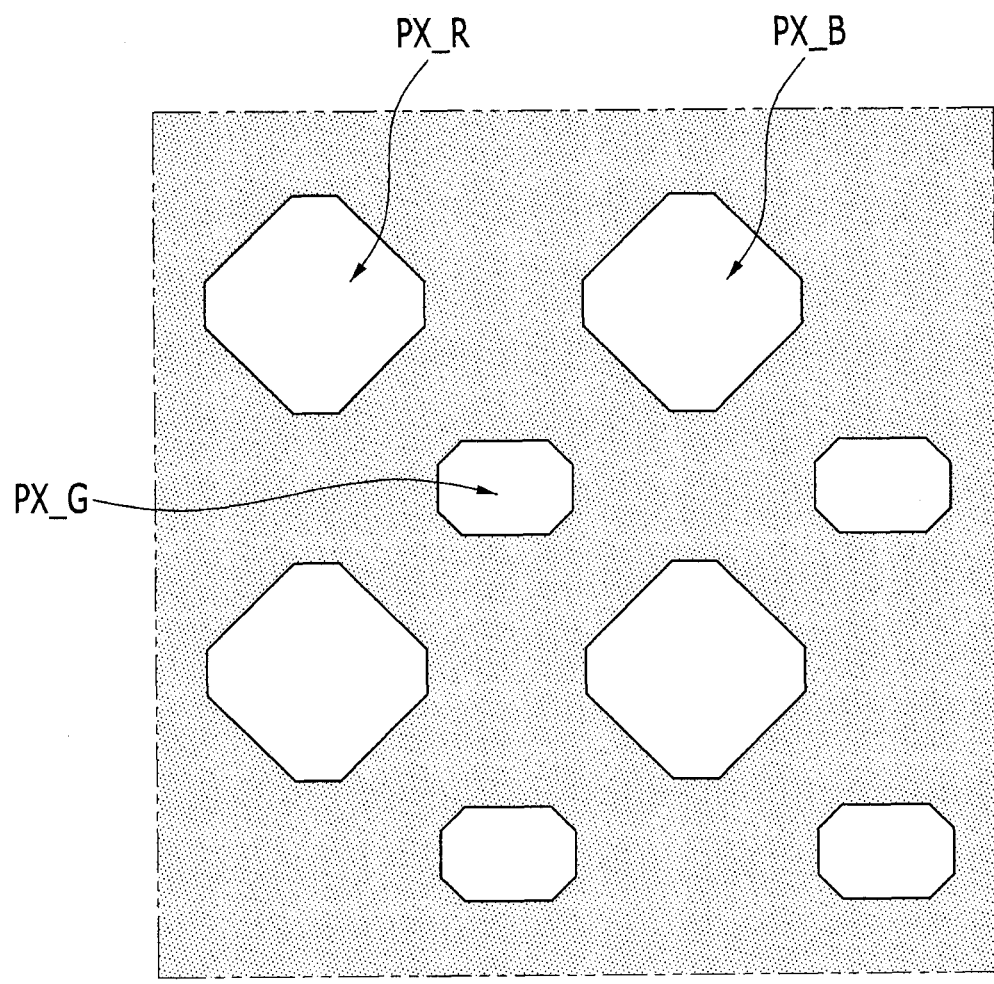
FIG. 2 is a plan view of the organic light emitting diode display of FIG. 1 in which a light blocking layer is disposed.

Referring to FIG. 2, the light blocking layer 500 (the shaded portion) covers the second electrode 180 except for the pixel area (the unshaded portion) in which the organic light emitting layer 170 is positioned. For example, in the light blocking layer 500, openings are formed at positions corresponding to pixel areas of a red pixel (PX-R), a green pixel (PX-G), and a blue pixel (PX-B). Light emitted from the organic light emitting layer 170 may be transferred to the outside through the openings of the light blocking layer 500.

The light blocking layer 500 may contain a light blocking material. In more detail, the light blocking layer 500 may be made of material capable of blocking reflection of light transferred from the outside of the organic light emitting diode display. For example, the light blocking layer 500 may contain at least one of carbon black, carbon nanotube (CNT), and a black dye. When light transferred from the outside, for example, sunlight, is reflected, contrast and visibility may be deteriorated. However, when reflection of external light is blocked by the light blocking layer 500 as described above, it may be possible to prevent contrast and visibility from being deteriorated. When a user uses such a display outdoors, the user may see a vivid image of which contrast and visibility are not deteriorated.

Further, in comparable organic light emitting diode displays, a circular polarizing plate may be provided to block reflection of external light. This circular polarizing plate does not have high light transmittance, such that although reflection of external light may be decreased, transmission of light emitted from the inside of the organic light emitting elements may also decrease. In addition, this circular polarizing plate is composed of a linear polarizing plate and a 90° phase retardation film, which increases thickness of the organic light emitting diode display. Therefore, according to embodiments of the present invention, the light blocking layer 500 is disposed instead of the circular polarizing plate of comparable organic light emitting diode displays, such that light emitted from the organic light emitting layer is appropriately transferred to the outside, thereby making it possible to increase light efficiency.

In addition, the circular polarizing plate of comparable organic light emitting diode displays is removed, such that the entire thickness of the display may be decreased. Therefore, the organic light emitting diode display according to embodiments of the present invention may be applied to a flexible display, which may be an ultra-thin type display.

In addition, the light blocking layer 500 may further contain a conductive metal, a conductive metal oxide, or a conductive metal nitride. The light blocking layer 500 may contain the conductive metal, the conductive metal oxide, or the conductive metal nitride in addition to the light blocking material.

When the light blocking layer 500 has conductivity, resistance of the second electrode 180 coming in direct contact with the light blocking layer 500 may be decreased. For example, when the light blocking layer 500 having conductivity comes in direct contact with the second electrode 180, an effect of increasing the thickness of the second electrode 180 may be obtained. When the effective thickness of the second electrode 180 is increased, resistance of the second electrode 180 is decreased. Therefore, it is possible to prevent luminance from being non-uniform by a voltage drop (IR drop) generated in the organic light emitting diode display. As a result, when the light blocking layer 500 has conductivity, the light blocking layer 500 may serve as an auxiliary electrode for preventing the voltage drop.

The conductive metal of the light blocking layer 500 may be, for example, any one metal selected from the group consisting of Al, Ag, Mg, Cr, Ti, Ni, Au, Ta, Cu, Ca, Co, Fe, Mo, W, Pt, Yb, and NiS, or an alloy thereof. Further, the conductive metal oxide of the light blocking layer 500 may be any one selected from the group consisting of $CrO_x$ (x≥1), $CuO_x$ (x≥1), and $MoO_x$ (x≥1), or a combination thereof. In addition, the conductive metal nitride of the light blocking layer 500 may be any one selected from the group consisting of $TiN_x$ (x≥1), $TiN_xAl$ (x≥1), and $CrN_x$ (x≥1), or a combination thereof.

An encapsulation layer 400 may be formed on the second electrode 180 and the light blocking layer 500. The encapsulation layer 400 seals the organic light emitting element LD and a driving circuit unit from the outside to protect them.

The encapsulation layer 400 may include a thin-film encapsulation layer that may be formed by depositing an inorganic film and an organic film on the second electrode 180. The thin film encapsulation layer may include organic- and inorganic-encapsulation films that are alternately stacked one by one. For example, two organic encapsulation films and two inorganic encapsulation films that are alternately stacked one by one may be used to constitute the encapsulation layer 400, but the present invention is not limited thereto.

In addition, a touch panel 700 may be disposed on the encapsulation layer 400. The touch panel 700 may sense a contact by an external object. Here, the contact may refer to when an external object such as a hand of a user approaches the organic light emitting diode display or hovers in an approached state as well as when the external object comes in direct contact with a front surface of the organic light emitting diode display.

A first adhesive layer 600 may be interposed between the touch panel 700 and the encapsulation layer 400. The touch panel 700 may be adhered onto the encapsulation layer 400 by the first adhesive layer 600. The first adhesive layer 600 may include a silicon-based or acrylic compression-bonding type adhesive having a low modulus such as PSA, but the present invention is not limited thereto.

In addition, a second adhesive layer 800 is disposed on the touch panel 700. A window 900 may be adhered to the touch panel 700 by the second adhesive layer 800. Like the first adhesive layer 600, the second adhesive layer 800 may include a silicon-based or acrylic compression-bonding type adhesive having a low modulus such as PSA, but the present invention is not limited thereto.

Hereinafter, an organic light emitting diode display according to a second embodiment will be described with reference to FIG. 3. Detailed descriptions of the same or similar components to those of FIG. 1 may not be repeated.

Figure 3:
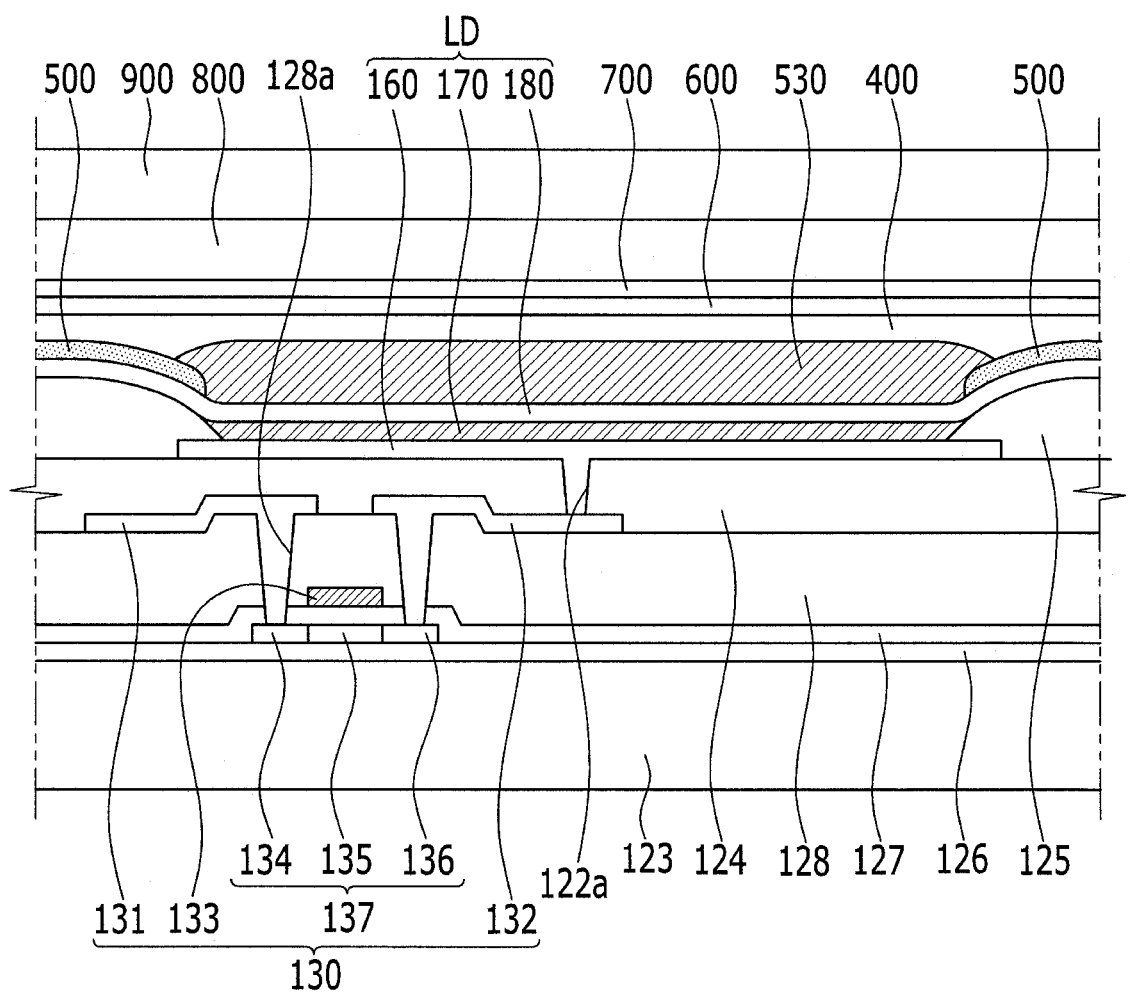
FIG. 3 is a schematic cross-sectional view of an organic light emitting diode display according to a second embodiment of the present invention.

FIG. 3 is a schematic cross-sectional view of the organic light emitting diode display. Referring to the organic light emitting diode display of FIG. 3, a color filter layer 530 contacting the second electrode 180 may be disposed at a position corresponding to the pixel area.

In the embodiment of FIG. 1, the light blocking layer 500 is disposed on the second electrode 180, exposing the second electrode 180 at positions corresponding to the pixel area.

In FIG. 3, the color filter layer 530 is disposed in the exposure region of the light blocking layer 500. The color filter layer 530 contacts the second electrode 180. In further detail, the color filter layer 530 contacts the second electrode 180 while filling the exposure region of the light blocking layer 500.

The color filter layer 530 is disposed at the pixel area, such that the color filter layer 530 is positioned corresponding to a path of light emitted from the organic light emitting layer 170. The light emitted from the organic light emitting layer 170 passes through the color filter layer 530. The color filter layer 530 may be formed on the second electrode 180 by, for example, an inkjet printing process, a transcription process, or a deposition process.

The color filter layer 530 may increase transmittance of the light emitted from the organic light emitting layer 170 as compared to the polarizing plate of comparable organic light emitting diode displays. Transmittance of such polarizing plates may be only 40% to 45%, but when the color filter layer 530 is used instead, transmittance may be increased to 80% or more. The organic light emitting diode display according to embodiments of the present invention has excellent light efficiency as compared to a comparable organic light emitting diode display using the polarizing plate.

Further, when the light efficiency of the organic light emitting diode display is increased, power consumption may be decreased. In addition, lifetime of the organic light emitting layer 170 of the organic light emitting diode display may be increased.

An encapsulation layer 400 may be formed on the light blocking layer 500 and the color filter layer 530. As described above, the encapsulation layer 400 seals the organic light emitting element LD and a driving circuit unit from the outside to protect them.

The encapsulation layer 400 may include a thin-film encapsulation layer that may be formed by depositing an inorganic film and an organic film on the second electrode 180. The thin film encapsulation layer may include organic- and inorganic-encapsulation films that are alternately stacked one by one. For example, two organic encapsulation films and two inorganic encapsulation films are alternately stacked one by one may be used to constitute the encapsulation layer 400, but the present invention is not limited thereto.

In addition, as described in the embodiment of FIG. 1, a touch panel 700 and a window 900 may be disposed on the encapsulation layer 400. A first adhesive layer 600 may be interposed between the touch panel 700 and the encapsulation layer 400. The touch panel 700 may be adhered onto the encapsulation layer 400 by the first adhesive layer 600. Further, a second adhesive layer 800 may be disposed on the touch panel 700. The window 900 may be adhered to the touch panel 700 by the second adhesive layer 800.

Hereinafter, an organic light emitting diode display according to a third embodiment will be described with reference to FIG. 4 in addition to FIGS. 1 and 3 described above. Detailed descriptions of the same or similar components to those of the above-mentioned displays may not be repeated.

Figure 4:
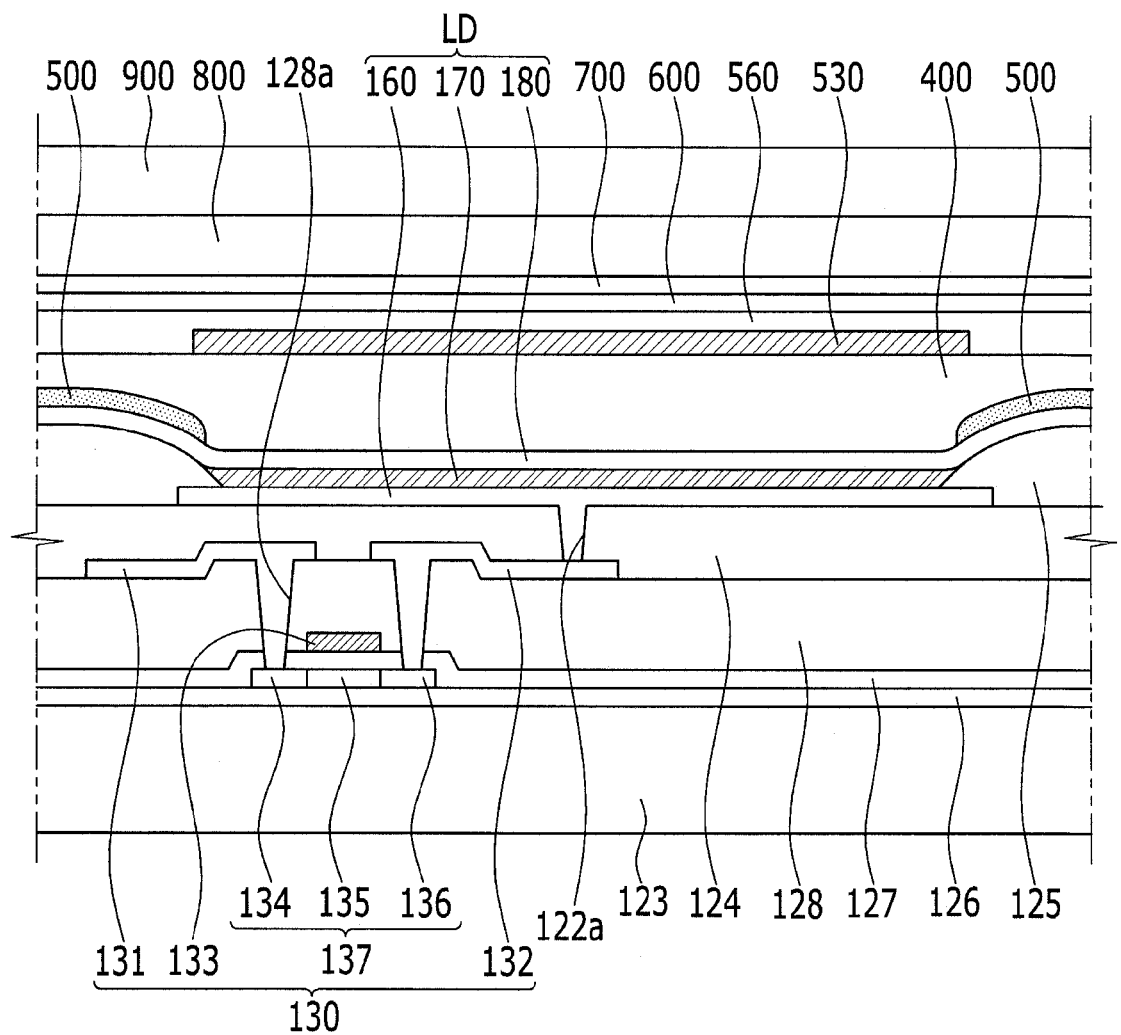
FIG. 4 is a schematic cross-sectional view of an organic light emitting diode display according to a third embodiment of the present invention.

FIG. 4 is a schematic cross-sectional view of the organic light emitting diode display. Referring to the organic light emitting diode display of FIG. 4, an encapsulation layer 400 is disposed on a second electrode 180 and a light blocking layer 500, unlike the organic light emitting diode display of FIG. 3. In FIG. 4, a color filter layer contacting the second electrode 180 is not disposed on the second electrode 180 at a position corresponding to a pixel area. In other respects, the organic light emitting diode display of FIG. 4 has substantially the same configuration from the substrate 123 to the encapsulation layer 400 of the organic light emitting diode display of FIGS. 1 and 3.

In the organic light emitting diode display of FIG. 4, a color filter layer 530 may be disposed on the encapsulation layer 400. The color filter layer 530 is positioned corresponding to a path of light emitted from the organic light emitting layer 170. FIG. 4 illustrates a structure of a pixel emitting single-color light, for example, red light. Here, the color filter layer 530 may have a red color, and a red organic light emitting layer 170 emitting red light may be positioned under the color filter layer 530. In other embodiments, a white organic light emitting layer 170 (or some other color light emitting layer 170 whose light emission includes at least red light) may be positioned under the color filter layer 530.

In the embodiment of FIG. 3, the color filter layer 530 is disposed to contact the second electrode 180 at the position corresponding to the pixel area, but in the embodiment of FIG. 4, the color filter layer 530 is disposed to be spaced apart from the second electrode 180.

As described above, the organic light emitting diode display of FIG. 4 including the color filter layer 530 may increase transmittance of light emitted from the organic light emitting layer 170 as compared to the polarizing plate of comparable organic light emitting diode displays. Transmittance of such polarizing plates may be only 40% to 45%, but when the color filter layer 530 is disposed, transmittance may be increased to 80% or more. The organic light emitting diode display of FIG. 4 has excellent light efficiency as compared to an organic light emitting diode display using the polarizing plate.

Further, when the light efficiency of the organic light emitting diode display of FIG. 4 is increased, power consumption may decrease. In addition, lifetime of the organic light emitting layer 170 may increase.

An overcoat layer 560 for protecting the color filter layer 530 and planarizing a surface of a layer on which the color filter layer 530 is formed may be provided on the color filter layer 530. As an example, an inorganic insulating layer or organic insulating layer may be used for the overcoat layer 560. Here, the inorganic insulating layer may contain $SiO_2$, SiNx, SiON, $Al_2O_3$, $TiO_2$, $Ta_2O_5$, $HfO_2$, $ZrO_2$, BST, PZT, or the like, and the organic insulating layer may contain one or more of a general purpose polymer (PMMA, PS), a polymer derivative having a phenol group, an acrylic polymer, an imide-based polymer, a arylether-based polymer, an amide-based polymer, a fluorine-based polymer, a p-xylene-based polymer, a vinylalcohol-based polymer, and a blend thereof, and the like. The overcoat layer 560 may also be formed as a composite laminate of the inorganic insulating layer and the organic insulating layer. In addition, using a material having high transmittance helps keeping the light emitting efficiency as high as possible or practical.

In the present embodiment, a touch panel 700 may be disposed on the overcoat layer 560 covering the color filter layer 530. The touch panel 700 may sense a contact by an external object. Here, contact may refer to when an external object such as a hand of a user approaches the organic light emitting diode display or hovers in an approached state as well as when the external object comes in direct contact with a front surface of the organic light emitting diode display.

A first adhesive layer 600 may be interposed between the touch panel 700 and the overcoat layer 560. The touch panel 700 may be adhered onto the color filter layer 530 by the first adhesive layer 600.

The first adhesive layer 600 may include a silicon-based or acrylic compression-bonding type adhesive having a low modulus such as PSA, but the present invention is not limited thereto. In other embodiments, the overcoat layer 560 may be omitted.

In addition, a second adhesive layer 800 is disposed on the touch panel 700. A window 900 may be adhered to the touch panel 700 by the second adhesive layer 800. Like the first adhesive layer 600, the second adhesive layer 800 may include a silicon-based or acrylic compression-bonding type adhesive having a low modulus such as PSA, but the present invention is not limited thereto.

Hereinafter, an organic light emitting diode display according to a fourth embodiment will be described with reference to FIG. 5 in addition to FIGS. 1, 3, and 4 described above. Detailed descriptions of the same or similar components to those of the above-mentioned displays may not be repeated.

Figure 5:
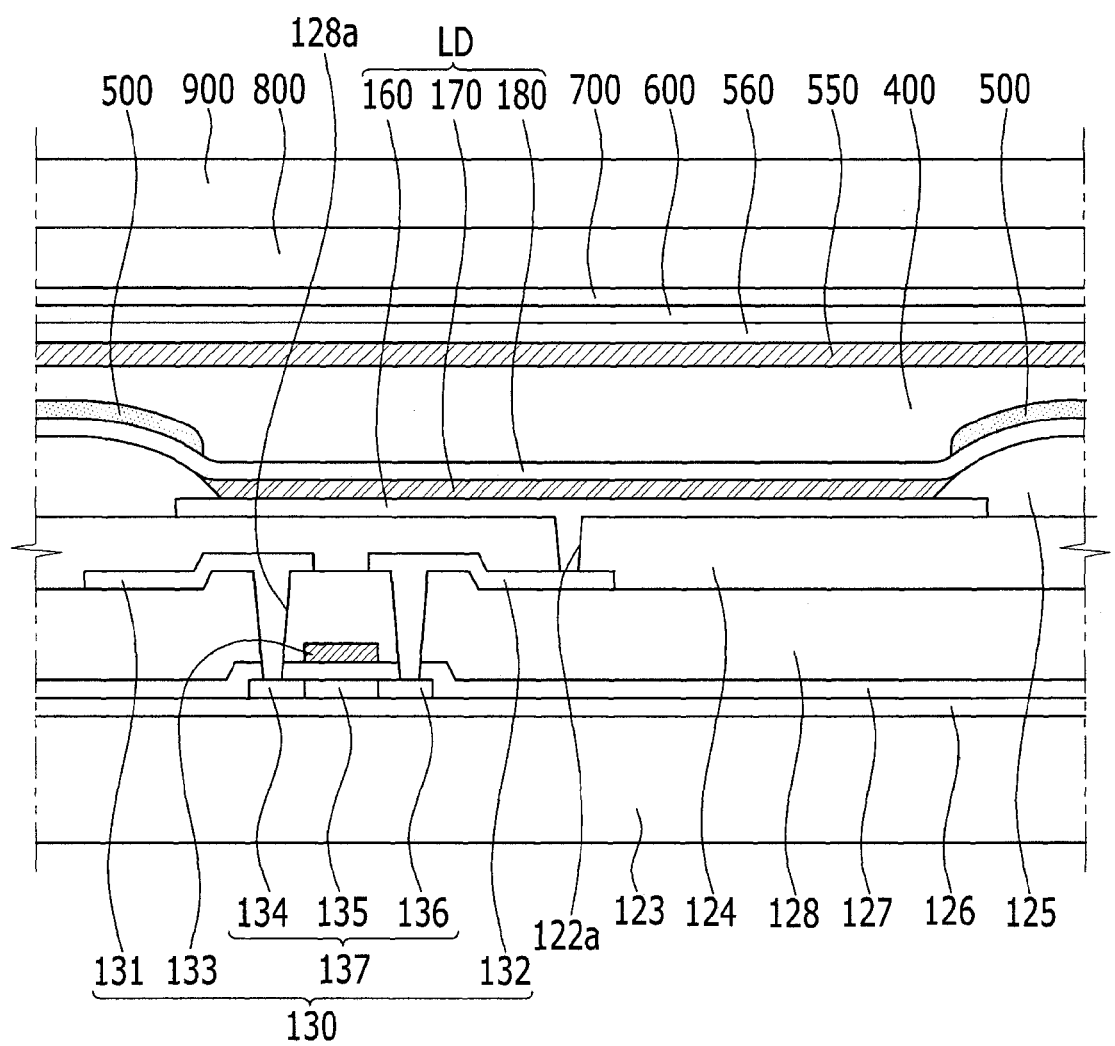
FIG. 5 is a schematic cross-sectional view of an organic light emitting diode display according to a fourth embodiment of the present invention.

FIG. 5 is a schematic cross-sectional view of the organic light emitting diode display. Referring to the organic light emitting diode display of FIG. 5, a polarizing plate 550 is positioned at a position corresponding to the color filter layer 530 of FIG. 4.

The organic light emitting diode display of FIG. 5 has substantially the same configuration from the substrate 123 to the encapsulation layer 400 as those of the organic light emitting diode displays of FIGS. 1, 3, and 4.

In FIG. 5, the polarizing plate 550 may be disposed on the encapsulation layer 400. The polarizing plate 550 changes an optical axis of light emitted from the organic light emitting layer 170 to the outside. The polarizing plate may have a structure in which a transparent protective film is stacked on both surfaces or one surface of a polarizer made of a poly vinyl alcohol-based resin.

In further detail, the polarizing plate 550 may have a structure in which a triacetyl cellulose (TAC) film as the protective film is adhered to a polarizer having a structure in which a poly vinyl alcohol (hereinafter, referred to as PVA)-based molecular chain is aligned in a set or predetermined direction and an iodine-based compound or a dichroic polarizing material is contained. For example, the polarizer and the protective film may be adhered to each other by an aqueous adhesive made of a poly vinyl alcohol-based aqueous solution. However, the polarizing plate 550 is not limited thereto, and in other embodiments, polarizing plates having various structures may be used.

An overcoat layer 560 may be provided on the polarizing plate 550. However, in other embodiments, the overcoat layer 560 may be omitted.

In addition, as described in the embodiment of FIG. 4, a touch panel 700 and a window 900 may be disposed on the polarizing plate 550. In addition, a first adhesive layer 600 may be interposed between the touch panel 700 and the polarizing plate 550. The touch panel 700 may be adhered onto the polarizing plate 550 by the first adhesive layer 600 (possibly with the overcoat layer 560 therebetween).

In addition, a second adhesive layer 800 is disposed on the touch panel 700. The window 900 may be adhered to the touch panel 700 by the second adhesive layer 800.

Hereinafter, an organic light emitting diode display according to a fifth embodiment will be described with reference to FIG. 6 in addition to FIG. 1 and other embodiments described above. Detailed descriptions of the same or similar components to those of the above-described displays may not be repeated.

Figure 6:
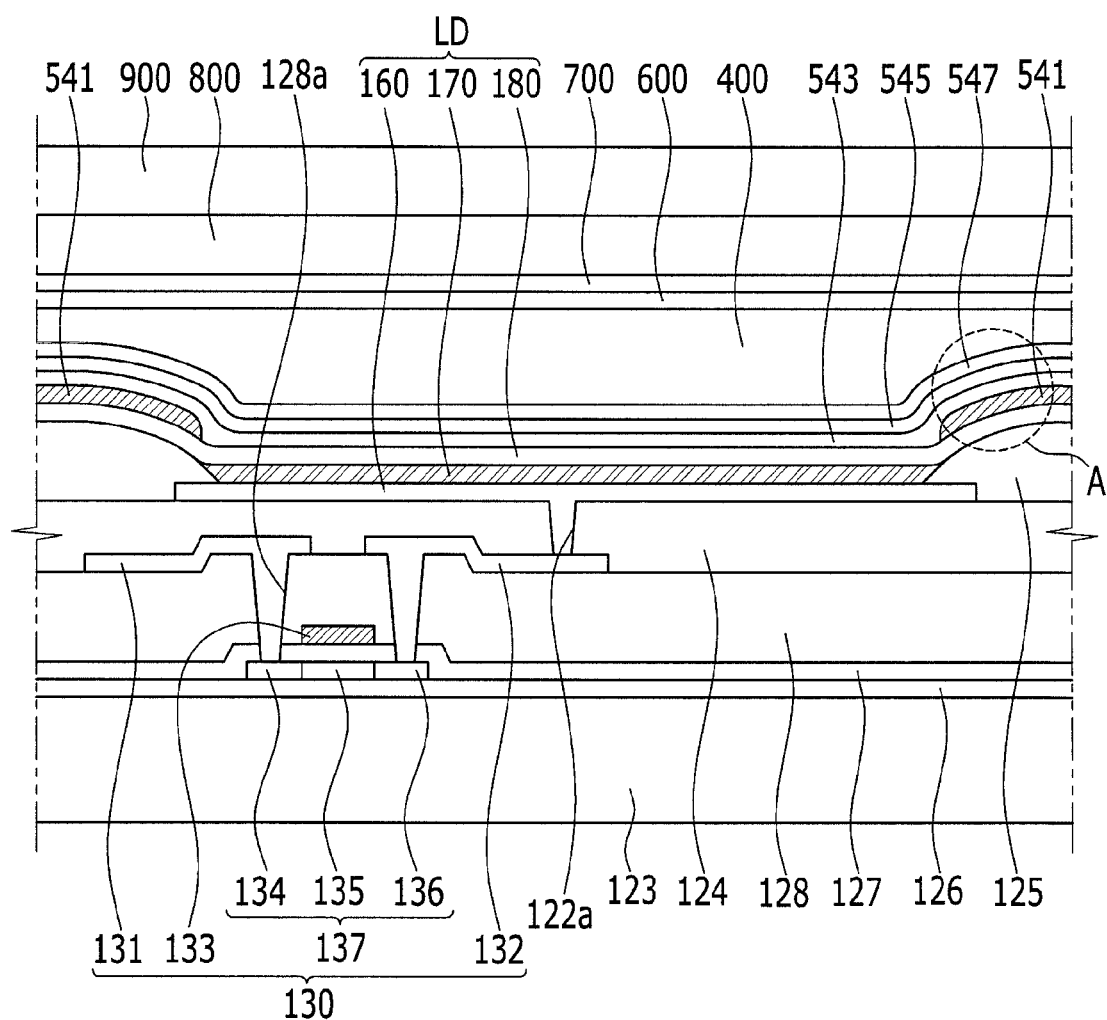
FIG. 6 is a schematic cross-sectional view of an organic light emitting diode display according to a fifth embodiment of the present invention.

FIG. 6 is a schematic cross-sectional view of the organic light emitting diode display. Referring to the organic light emitting diode display of FIG. 6, a first metal layer 541, a first intermediate layer 543, a second metal layer 545, and a second intermediate layer 547 are disposed on a second electrode 180. External light reflected by the first metal layer 541 destructively interferes with light reflected by the second metal layer 545 and light that does not destructively interfere is absorbed in the second metal layer 545 by adjusting thicknesses of the first and second intermediate layers 543 and 547.

An exposure region at which the second electrode 180 is exposed is formed in the first metal layer 541 at a position corresponding to the pixel area. The first metal layer 541 may cover the second electrode 180 except for the pixel area in which the organic light emitting layer 170 is positioned. The first metal layer 541 may be a highly reflective layer, and may be made of any one selected from the group consisting of Ag, Al, Mg, Cr, Ti, Ni, W, Au, Ta, Cu, Co, Fe, Mo, and Pt, or an alloy thereof.

In addition, the first intermediate layer 543 is positioned on the first metal layer 541. The first intermediate layer 543 may cover the first metal layer 541 and the second electrode 180. However, the first intermediate layer 543 is not limited thereto, and in other embodiments, may be formed at positions corresponding to only the first metal layer 541. The first intermediate layer 543 may be positioned to cover only the first metal layer 541.

The first intermediate layer 543 may serve, for example, to control a relative phase of light reflected by the second electrode 180 with respect to light reflected by the second metal layer 545 to be about 180°. As described above, the first intermediate layer 543 used as a phase control layer may be made of any one or more selected from the group consisting of $SiO_x$ ($x \geq 1$), $SiN_x$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$, and $In_2O_3$.

The second metal layer 545 may be positioned on the first intermediate layer 543. The second metal layer 545 may cover the first intermediate layer 543. However, the second metal layer 545 is not limited thereto, and in other embodiments, may be formed at positions corresponding to only the first metal layer 541. The second metal layer 545 may be positioned on the first intermediate layer 543 to cover only the first metal layer 541.

The second metal layer 545 may include a material capable of performing destructive interference as described above and absorbing a large amount of light. For example, the second metal layer 545 may be made of any one selected from the group consisting of Cr, Ti, Mo, Co, Ni, W, Al, Ag, Au, Cu, Fe, Mg, and Pt, or an alloy thereof. With the metal layers as described above, light may be effectively absorbed in the entire wavelength region of visible light due to a destructive interference effect caused by reflection of the metal layers and a high light absorption ratio, such that reflection of external light may be decreased.

In addition, the second intermediate layer 547 is positioned on the second metal layer 545. The second intermediate layer 547 may cover the second metal layer 545. However, the second intermediate layer 547 is not limited thereto, and in other embodiments, may be formed at positions corresponding to only the first metal layer 541.

The second intermediate layer 547 may perform a phase compensation function of compensating for a phase to correspond to a deviation from a 180° phase depending on a wavelength of external light. It is difficult to maintain a phase difference of light reflected in the entire wavelength of visible light to 180° only with the above-mentioned first intermediate layer 543. Therefore, the second intermediate layer 547 compensates for the phase to correspond to the deviation from the 180° phase. As described above, the second intermediate layer 547 used as the phase compensation layer may be made of any one or more selected from the group consisting of $SiO_x$ ($x \geq 1$), $SiN_x$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$, and $In_2O_3$.

Figure 7:
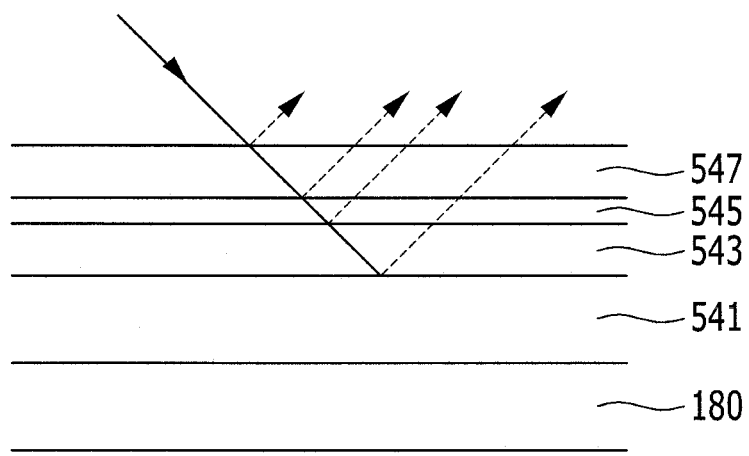
FIG. 7 is a partially enlarged cross-sectional view of region A of the organic light emitting diode display of FIG. 6.

FIG. 7 is a partially enlarged cross-sectional view of region A of the organic light emitting diode display of FIG. 6. External light transferred from the outside of the display may be reflected by the second intermediate layer 547, the second metal layer 545, the first intermediate layer 543, and the first metal layer 541. As described above, external light reflected by the first metal layer 541 may destructively interfere with light reflected by the second metal layer 545. In addition, light that does not destructively interfere may be absorbed in the second metal layer 545. As described above, reflection of the external light by the first metal layer 541, the first intermediate layer 543, the second metal layer 545, and the second intermediate layer 547 may be decreased.

Figure 8:
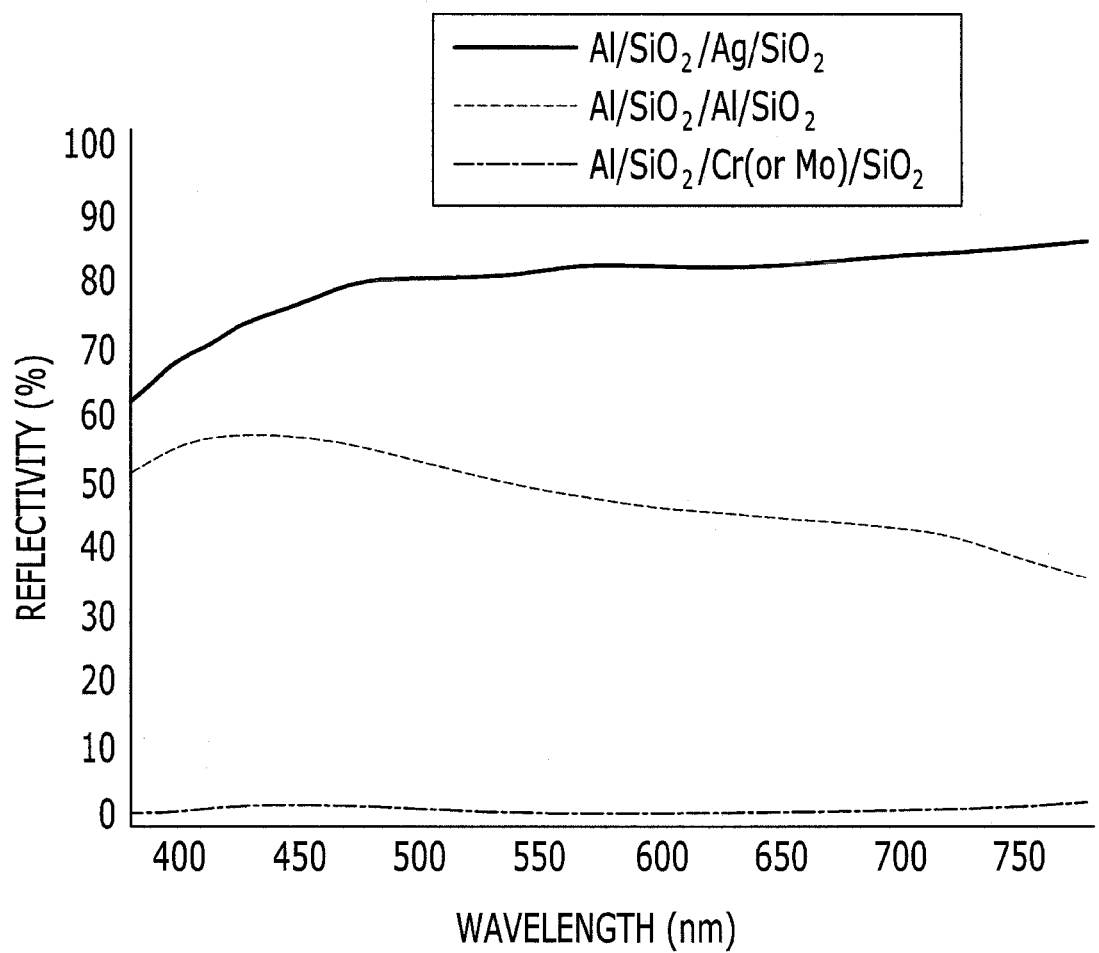
FIG. 8 is a graph illustrating an effect of decreasing external reflection by the organic light emitting diode display of FIGS. 6 and 7.

FIG. 8 is a graph illustrating an effect of decreasing external reflection by the organic light emitting diode display of FIGS. 6 and 7. As illustrated in FIG. 8, as compared to when the first metal layer 541, the first intermediate layer 543, the second metal layer 545, and the second intermediate layer 547 are made of Al, $SiO_2$, Ag, and $SiO_2$, respectively (the top line in FIG. 8), or when the first metal layer 541, the first intermediate layer 543, the second metal layer 545, and the second intermediate layer 547 are made of Al, $SiO_2$, Al, and $SiO_2$, respectively (the middle line of FIG. 8), when the first metal layer 541, the first intermediate layer 543, the second metal layer 545, and the second intermediate layer 547 are made of Al, $SiO_2$, Cr or Mo, and $SiO_2$, respectively (the bottom line of FIG. 8), reflectivity of external light is low.

As described above, when the second metal layer 545 is made of Cr or Mo, reflectivity of external light may be significantly decreased.

As illustrated in FIGS. 1, 3, 4, and 5, in organic light emitting diode displays according to embodiments of the present invention, reflection of external light may be blocked by the light blocking layer 500 positioned on the pixel defining layer 125, which may prevent contrast and visibility from being deteriorated. When a user uses such a display outdoors, the user may see a vivid image of which contrast and visibility are not deteriorated. Further, as illustrated in FIGS. 1, 3, 4, and 6, when removing the polarizing plate present in comparable organic light emitting diode displays, the entire thickness of the display may be decreased. Therefore, organic light emitting diode displays according to embodiments of the present invention may be applied to a flexible display, which may be an ultra-thin type display, While the present invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims and their equivalents.

| Description of some symbols | | | |
|---|---|---|---|
| 123 | substrate | 125 | pixel defining layer |
| 160 | first electrode | 170 | organic light emitting layer |
| 180 | second electrode | 400 | encapsulation layer |
| 500 | light blocking layer | 530 | color filter layer |
| 550 | polarizer | 541 | first metal layer |
| 543 | first intermediate layer | 545 | second metal layer |
| 547 | second intermediate layer | 900 | window |

What is claimed is:

1. An organic light emitting diode display comprising:
a substrate;
a thin film transistor on the substrate;
a first electrode on and connected to the thin film transistor;
a pixel defining layer on the first electrode and defining a pixel area;
an organic light emitting layer on the first electrode and contacting the first electrode exposed in the pixel area;
a second electrode on the organic light emitting layer;
a first metal layer on the second electrode and exposing the second electrode at a position corresponding to the pixel area;
a first intermediate layer covering the first metal layer;
a second metal layer covering the first intermediate layer; and
a second intermediate layer covering the second metal layer.

2. The organic light emitting diode display of claim 1, wherein the first and second metal layers are configured so that external light reflected by the first metal layer and external light reflected by the second metal layer destructively interfere with each other.

3. The organic light emitting diode display of claim 1, wherein the first metal layer is selected from the group consisting of Ag, Al, Mg, Cr, Ti, Ni, W, Au, Ta, Cu, Co, Fe, Mo, and Pt, or an alloy thereof.

4. The organic light emitting diode display of claim 1, wherein the second metal layer is selected from the group consisting of Cr, Ti, Mo, Co, Ni, W, Al, Ag, Au, Cu, Fe, Mg, and Pt, or an alloy thereof.

5. The organic light emitting diode display of claim 1, wherein the first and second intermediate layers are selected from the group consisting of $SiO_x$ ($x \geq 1$), $SiN_x$ ($x \geq 1$), $MgF_2$, $CaF_2$, $Al_2O_3$, $SnO_2$, ITO, IZO, ZnO, $Ta_2O_5$, $Nb_2O_5$, $HfO_2$, $TiO_2$, and $In_2O_3$, or a combination thereof.

* * * * *